(12) United States Patent
Uchida et al.

(10) Patent No.: US 11,575,060 B2
(45) Date of Patent: Feb. 7, 2023

(54) LIGHT-RECEIVING ELEMENT AND DETECTION SYSTEM

(71) Applicant: CANON KABUSHIKI KAISHA, Tokyo (JP)

(72) Inventors: Takeshi Uchida, Tokyo (JP); Takako Suga, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 324 days.

(21) Appl. No.: 17/036,000

(22) Filed: Sep. 29, 2020

(65) Prior Publication Data

US 2021/0098644 A1    Apr. 1, 2021

(30) Foreign Application Priority Data

Oct. 1, 2019 (JP) .............................. JP2019-181577

(51) Int. Cl.
*H01L 31/101* (2006.01)
*G01J 1/44* (2006.01)
*H01L 31/0232* (2014.01)

(52) U.S. Cl.
CPC ............ *H01L 31/1013* (2013.01); *G01J 1/44* (2013.01); *H01L 31/02327* (2013.01); *G01J 2001/446* (2013.01)

(58) Field of Classification Search
CPC .. H01L 31/1013; H01L 31/02327; G01J 1/44; G01J 2001/446
See application file for complete search history.

(56) References Cited

U.S. PATENT DOCUMENTS 7,893,460 B2 * 2/2011 Ishimura ........... H01L 31/02327
257/431

FOREIGN PATENT DOCUMENTS

EP        1204148 A2    5/2002
JP     2002-151731 A    5/2002

* cited by examiner

*Primary Examiner* — Georgia Y Epps
*Assistant Examiner* — Don J Williams
(74) *Attorney, Agent, or Firm* — Venable LLP

(57) ABSTRACT

A light-receiving element, comprising a plurality of photodiodes formed by stacking in this sequence, a lower reflection mirror, a resonator including a photoelectric conversion layer, and an upper reflection mirror on a semiconductor substrate, wherein the plurality of photodiodes share the semiconductor substrate and the lower reflection mirror, the plurality of photodiodes includes a first photodiode having a resonance wavelength λ1 and a second photodiode having a resonance wavelength λ2 that is larger than the resonance wavelength λ1, and a reflectance of the lower reflection mirror has a first peak corresponding to the resonance wavelength λ1 and a second peak corresponding to the resonance wavelength λ2.

12 Claims, 10 Drawing Sheets

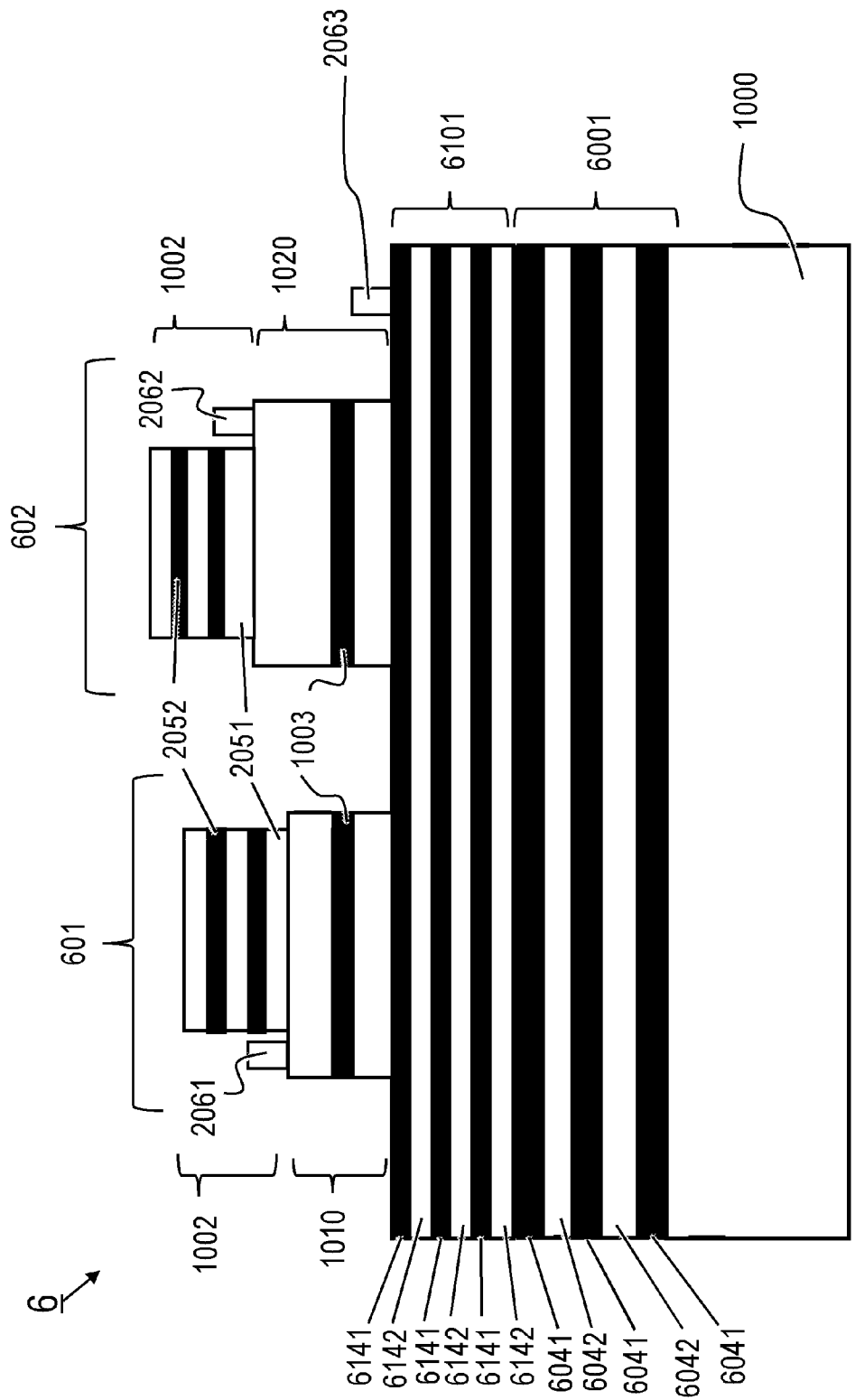

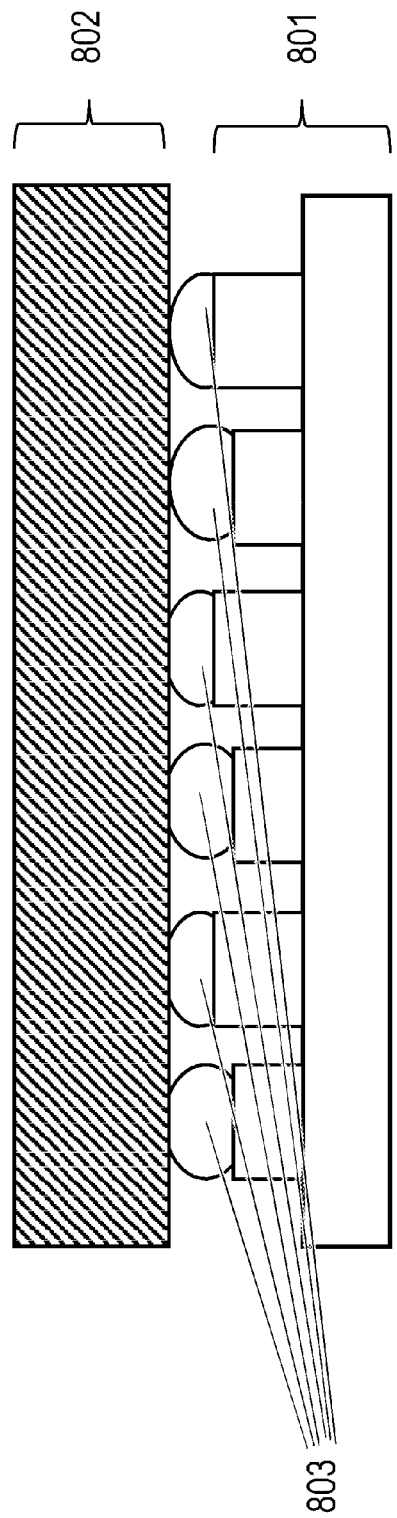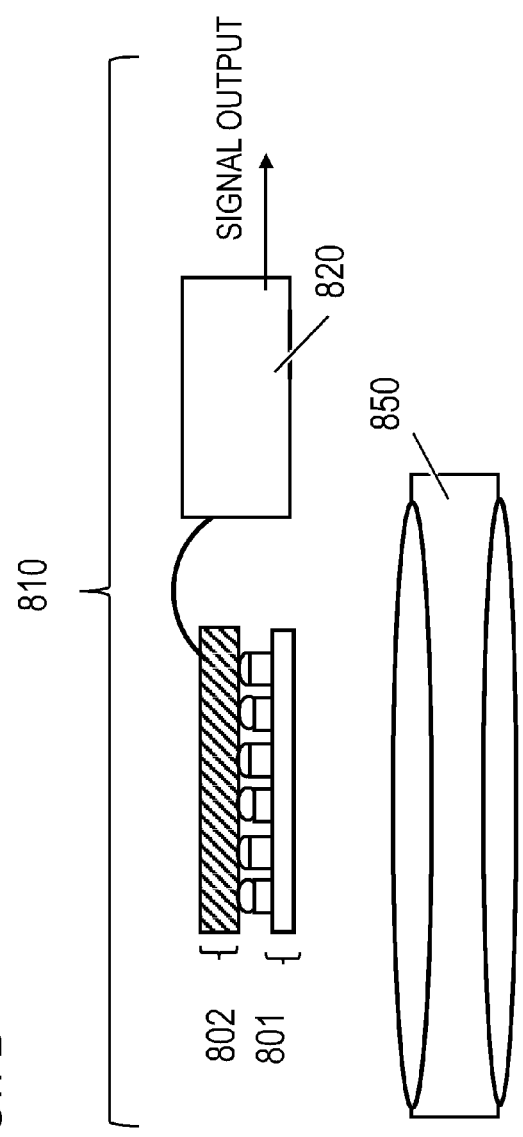
FIG.7A
FIG.7B

LIGHT-RECEIVING ELEMENT AND DETECTION SYSTEM

BACKGROUND OF THE INVENTION

Field of the Invention

The present invention relates to a light-receiving element and a detection system.

Description of the Related Art

A light-receiving element, which includes a resonator type photodiode (PD) constituted of a photoelectric conversion layer sandwiched by two reflection mirrors, and receives light (electromagnetic wave), is known.

Japanese Patent Application Publication No. 2002-151731 discloses a resonator type PD where a distributed Bragg reflector (DBR) made from InP/InGaAsP, which is a lower reflection mirror, a photoelectric conversion layer made from InGaAs, and an upper reflection mirror made from $SiO_2$/SiN, are formed on an InP substrate.

In the resonator type PD, the spectral sensitivity of the PD is highest at the resonant wavelength of the resonator including the photoelectric conversion layer, and a full width at half maximum of the spectral sensitivity is about 40 nm. The full width at half maximum is narrower than a commonly used PD. Therefore the resonator type PD is suitable for a purpose of receiving only a specific wavelength and vicinity of light.

The intended purposes of receiving a specific wavelength of light are, for example, receiving information from the specific wavelength of light, and visualizing the specific wavelength of light as a two-dimensional image. For example, by receiving light having a wavelength corresponding to an absorption wavelength unique to a substance, the presence of the substance can be detected and a two-dimensional image of a distribution of the substance can be acquired. Generally the absorption unique to a substance is clearly observed in a wavelength range longer than 1 μm. In some cases of receiving a specific wavelength of light and acquiring information thereof, it is preferable for the apparatus to receive a plurality of wavelengths of light (at least two specific wavelengths), rather than receiving only one specific wavelength of light.

The resonance type PD disclosed in Japanese Patent Application Publication No. 2002-151731, which has high sensitivity only for the vicinity of the wavelength corresponding to the resonance wavelength, is suitable for a light-receiving element that receives a specific one wavelength of light. In particular, a resonance type PD having a resonance wavelength in a wavelength range that is longer than 1 μm, where the absorption spectrum of the substance clearly appears, is a preferable light-receiving element. Further, in the case of a resonance type PD, the wavelength at the sensitivity peak of the PD can be changed by changing the resonance wavelength. Therefore a plurality of PDs having sensitivity peaks at two different wavelengths can be fabricated monolithically (on the same substrate) by decreasing the thickness of a part of the resonators after the lower reflection mirrors and resonators, including a photoelectric conversion layer, are crystal-grown on the semiconductor substrate.

In this way, by adjusting the resonance wavelength (resonator length), a light-receiving element having sensitivity peaks at two specific wavelengths seems to be formed easily. However, in the case where these two specific wavelengths are completely different from each other, the light-receiving element having sensitivity peaks at two specific wavelengths cannot be formed because of the influence received from the members, other than the resonator, of the light-receiving element. In other words, the conventional art is not capable of forming a light-receiving element which includes a plurality of photodiodes formed on a same substrate, and have sensitivity peaks at two specific wavelengths of light, which are completely different from each other.

SUMMARY OF THE INVENTION

With the foregoing in view, it is an object of the present technology to provide a light-receiving element, which includes a plurality of photodiodes formed on a same substrate and has sensitivity peaks at two completely different wavelengths of light.

An aspect of the disclosure of the present technology is:

A light-receiving element, comprising a plurality of photodiodes formed by stacking in this sequence, a lower reflection mirror, a resonator including a photoelectric conversion layer, and an upper reflection mirror on a semiconductor substrate, wherein the plurality of photodiodes share the semiconductor substrate and the lower reflection mirror, the plurality of photodiodes includes a first photodiode having a resonance wavelength $\lambda 1$ and a second photodiode having a resonance wavelength $\lambda 2$ that is larger than the resonance wavelength $\lambda 1$, and a reflectance of the lower reflection mirror has a first peak corresponding to the resonance wavelength $\lambda 1$ and a second peak corresponding to the resonance wavelength $\lambda 2$.

Further features of the present invention will become apparent from the following description of exemplary embodiments with reference to the attached drawings.

BRIEF DESCRIPTION OF THE DRAWINGS

FIG. 5 is a diagram depicting a light-receiving element according to Example 2;

FIG. 7A and FIG. 7B are diagrams depicting a detection system according to Example 3.

DESCRIPTION OF THE EMBODIMENTS

A light-receiving element (PD array; resonator type PD) that receives two different wavelengths of light (electromagnetic wave) will be described. First a problem generated in a light-receiving element, discovered by the inventors, will be described.

A light-receiving element is used to acquire information on two substances or to acquire two-dimensional images. For example, both ice and water have the nature of absorbing a 1.4 µm to 1.6 µm wavelength range of light. Therefore in the case where the light-receiving element accepts only one wavelength of light in this wavelength range, it can be determined that either ice or water exists, but it cannot be determined which, ice or water, exists.

Figure 8:
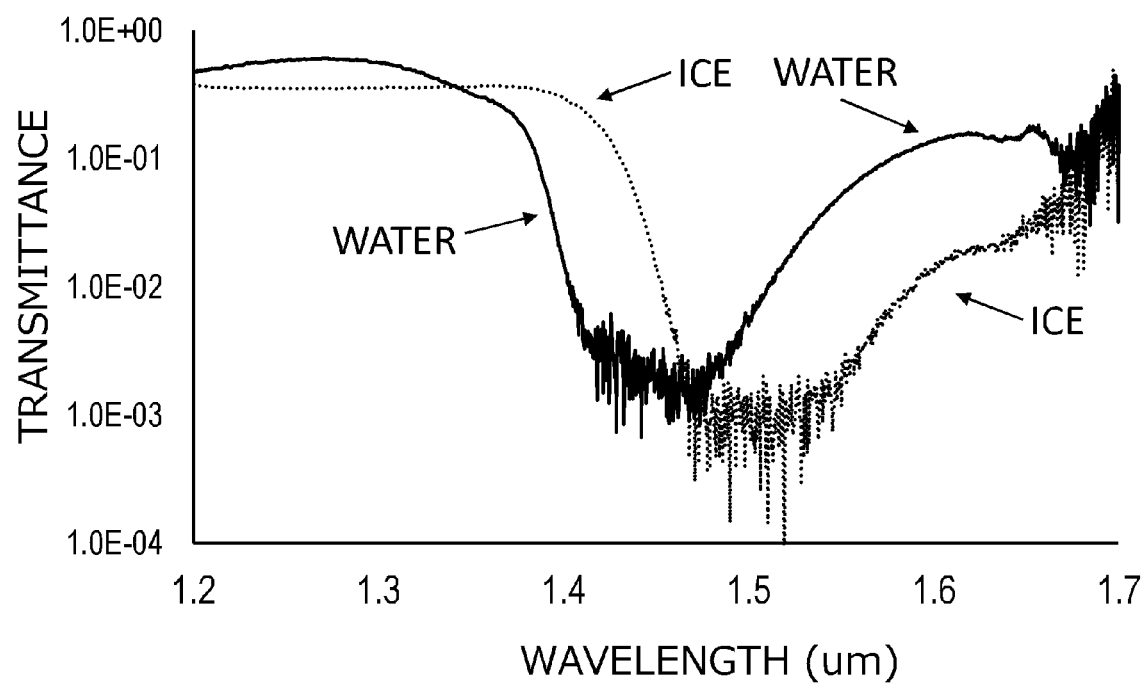
FIG. 8 is a graph for describing the absorption of light by water and ice.

On the other hand, in the case where the light-receiving element can accept two wavelengths of light, it can be determined which, ice or water, exists by receiving the two wavelengths of light (1.4 µm and 1.6 µm) and comparing the intensity of the light. This is because, as indicated in FIG. 8, in the case of water, a 1.4 µm wavelength of light has a stronger absorption (lower transmittance) than a 1.6 µm wavelength of light, and in the case of ice, a 1.6 µm wavelength of light has a stronger absorption that a 1.4 µm wavelength of light. By receiving the two wavelengths of light like this, ice and water can be discerned. Thus in some cases, by receiving the two specific wavelengths of light, which are determined based on the physical phenomena of the target, more detailed information on the detection target substance, which cannot be acquired by one wavelength of light alone, can be acquired.

However in the case of the light-receiving element, the photoelectric conversion layer is crystal-grown on the DBR (lower reflection mirror), hence the DBR must be implemented using a semiconductor that can crystal-grow the photoelectric conversion layer. In this case, materials that can be selected to form the DBR are limited, which means that the reflection band in the DBR used for the lower reflection mirror is limited. For example, in the case of fabricating the DBR (lower reflection mirror) on an InP substrate that supports 1.4 µm and 1.6 µm wavelengths of light, InP/InGaAsP, which can prevent inter-band absorption and can grow crystals on the InP substrate, can be used. However a practical range of one band of the reflectance spectrum of this DBR is about 100 to 150 nm. Therefore in this DBR, two wavelengths of which difference is larger than 150 nm, such as 1.4 µm and 1.6 µm, cannot be supported. Furthermore, if the reflectance of the DBR departs from the maximum wavelength (center wavelength), the dependency of reflectance on wavelength increases, and the influence of the deviation of the film thickness between design and actual crystal growth on the reflectance and the spectral sensitivity of PD also increases.

In the case of receiving a specific one wavelength of light alone, the wavelength at which the reflectance of the DBR is the maximum (center wavelength) is matched with the resonance wavelength, and if the reflectance is small, the reflectance can be increased by increasing the number of layers to be stacked in the DBR. In the case of receiving at least two wavelengths of light, on the other hand, the wavelengths of light to be reflected by the DBR may be distant from each other, but the band to acquire the optical reflectance by the DBR does not increase even if the number of layers to be stacked is increased, and is determined only by the refractive index difference between layers. Therefore if the material of the DBR is limited, increasing the reflectance is not easy.

Embodiment

Figure 1:
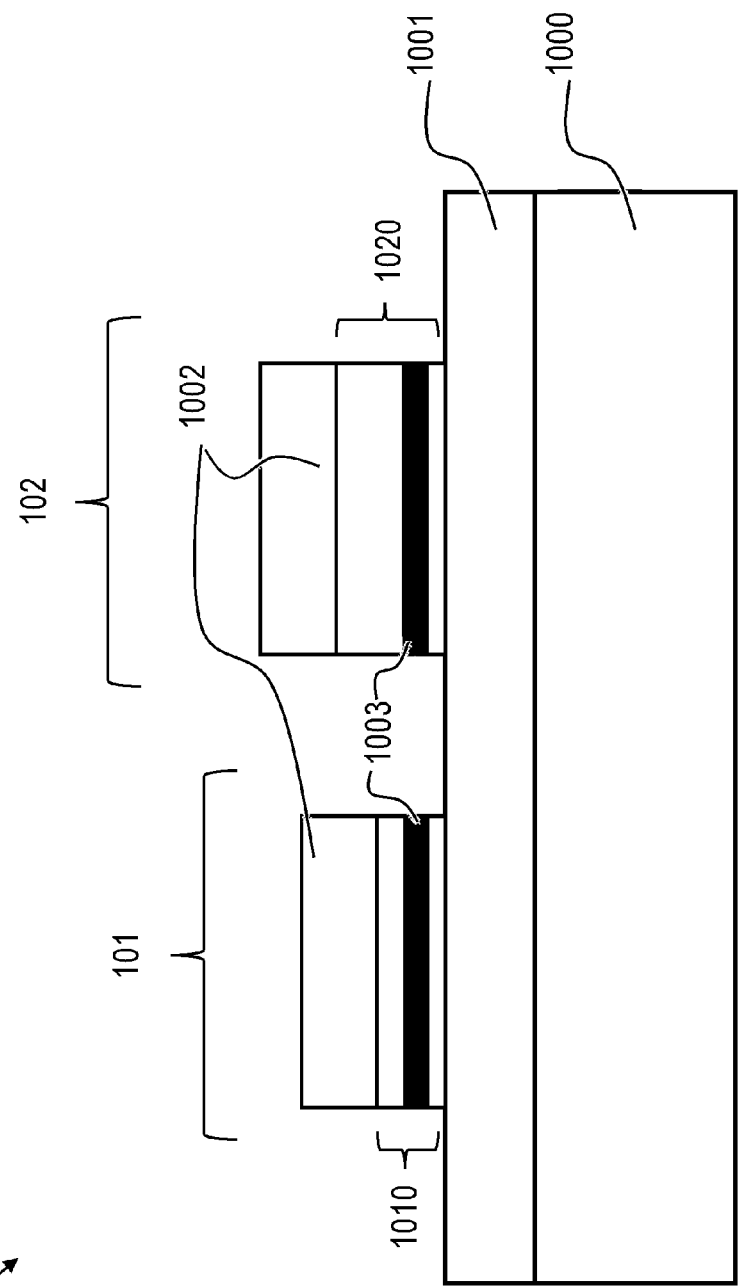
FIG. 1 is a diagram depicting a light-receiving element according to an embodiment.

To solve these problems, a light-receiving element 1 (PD array; resonator type PD) according to an embodiment will be described. The light-receiving element 1 according to this embodiment is illustrated in FIG. 1. The light-receiving element 1 includes two photodiode units (PD units) PD101 and PD102. In the light-receiving element 1, a semiconductor substrate 1000, a first reflection mirror 1001, a resonator unit 1010 (resonator unit 1020) and a second reflection mirror 1002 are sequentially stacked. In the following, a direction from the semiconductor substrate 1000 to the first reflection mirror 1001 in the stacking direction is referred to as "up".

The PD 101 and the PD 102 share the semiconductor substrate 1000 and the first reflection mirror 1001. The semiconductor substrate 1000 is an InP substrate. The PD 101 includes the resonator unit 1010, and the PD 102 includes the resonator unit 1020. The second reflection mirror 1002 is disposed on top of the resonator unit 1010 and the resonator unit 1020 respectively. The second reflection mirror 1002 is an upper reflection mirror, and the second reflection mirrors 1002 in the PD101 and the PD102 are formed of a same material. The resonance wavelength of the PD 101 is $\lambda 1$, and the resonance wavelength of the PD 102 is $\lambda 2$.

The resonator unit 1010 and the resonator unit 1020 include a photoelectric conversion layer 1003 respectively to convert light into electric signals. The configuration of the portion from the interface between the first reflection mirror 1001 and the resonator unit of each PD to the upper part of the photoelectric conversion layer 1003, is identical between the PD 101 and the PD 102.

The reflectance spectrum of the first reflection mirror 1001, which is the lower reflection mirror, has two peaks, and the peak wavelengths are approximately the same as the resonance wavelength $\lambda 1$ of the PD 101 and the resonance wavelength $\lambda 2$ of the PD 102. Thereby in the reflectance spectrum of the first reflection mirror 1001, sufficient reflectance to exhibit the resonance effect on $\lambda 1$ and $\lambda 2$ can be implemented, even if the width of one wavelength band having sufficient reflectance cannot be made wider than the wavelength difference between $\lambda 1$ and $\lambda 2$. Concrete examples of the configuration to implement the plurality of peaks and the effect of each configuration will be described in the following examples.

EXAMPLE 1

Example 1, which is a concrete example of the embodiment, will be described. The light-receiving element 1 according to Example 1 is designed to discern ice and water, and is designed such that the spectral sensitivity of the PD is the maximum at wavelength=1.4 µm and wavelength=1.6 µm. In other words, the wavelengths of the light detected by the light-receiving element 1 are 1.4 µm and 1.6 µm. Description on portions the same as the configuration of the light-receiving element 1 according to the embodiment described above will be omitted.

Configuration of Light-Receiving Element

Figure 2:
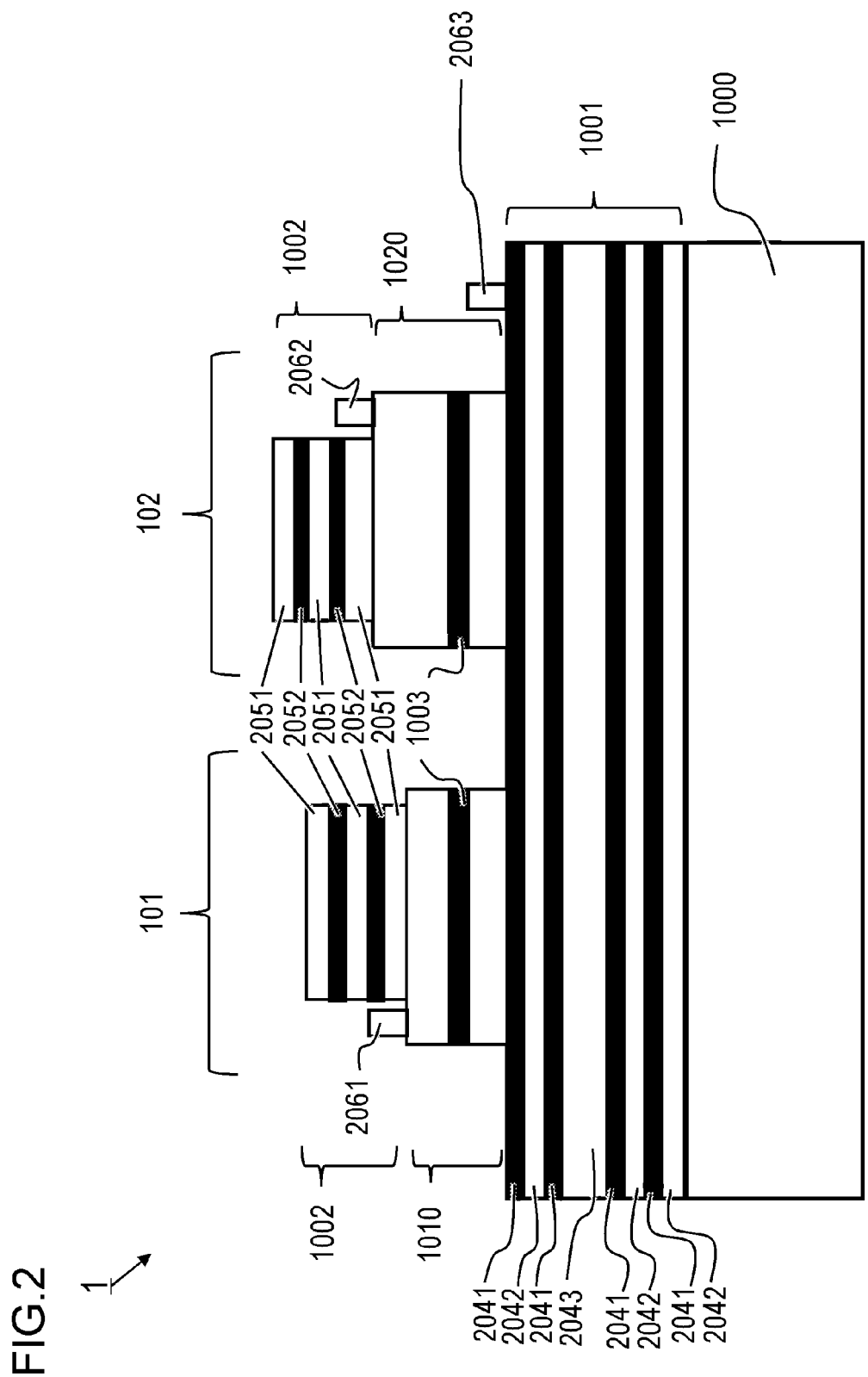
FIG. 2 is a diagram depicting a light-receiving element according to Example 1.

The light-receiving element 1 according to Example 1 will be described. FIG. 2 is a cross-sectional view of the light-receiving element 1. Here the resonance wavelength of the PD 101 is 1.4 µm, and the resonance wavelength of the PD 102 is 1.6 µm.

The first reflection mirror 1001 is constituted of an InGaAsP layer 2041, of which physical thickness is about 110 nm, and an InP layer 2042, of which physical thickness is about 120 nm, which are alternately stacked. The optical thickness of one layer of the InGaAsP layer 2041 and that of the InP layer 2042 are a quarter of the wavelength $\lambda=1520$ nm respectively. The optical thickness of the layer is a value determined by multiplying the physical layer thickness by a refractive index of this layer. Here the refractive index of the InP layer 2042 is lower than that of the InGaAsP layer 2041.

The first reflection mirror 1001 is formed in the same manner as a standard distributed Bragg reflector (DBR). In this description, the standard DBR refers to a reflection mirror constituted of alternately stacked two layers which have the same optical thickness, and each layer is formed of a different material. In the standard DBR, if the optical thickness of each layer is the wavelength λ=1520 nm, which is between the resonance wavelengths 1.4 μm and 1.6 μm, the reflectance spectrum of which center wavelength is around wavelength λ=1.5 μm can be formed by the first reflection mirror 1001. However the first reflection mirror 1001 according to Example 1 is not exactly the same as the standard DBR, and the physical thickness of the InP layer 2043 of the sixth pair alone, counted from the semiconductor substrate 1000 side, is 210 nm, which is thicker than the InP layer 2042. Here "pair" refers to one combination of the InP layer and the InGaAsP layer. In Example 1, the thickness of the InP layer of the sixth pair, counted from the semiconductor substrate 1000 side, is changed, but the thickness of the InP layer at any location may be changed. FIG. 2 does not illustrate all the layers (for a number of repeat cycles of the DBR) constituting the first reflection mirror 1001 and the second reflection mirror 1002.

The resonator unit 1010 is basically constituted of the InP layer and the photoelectric conversion layer 1003, and the total optical thickness of the resonator unit 1010 is 1.4 μm. The resonance wavelength of the PD 101 is different from that of the PD 102, and this is implemented by forming the InP layer portion above the photoelectric conversion layer 1003, then removing a part thereof.

The resonator unit 1020 is basically constituted of the InP layer and the photoelectric conversion layer 1003, and the total optical thickness of the resonator unit 1020 is 1.6 μm. In other words, the total optical thickness is different between the resonator unit 1010 and the resonator unit 1020. This is because the total value of the optical thickness of the layers existing between the first reflection mirror 1001 and the second reflection mirror 1002 is different between the PD 101 and the PD 102.

The photoelectric conversion layer 1003 is formed of InGaAs and the physical thickness is 70 nm. Generally the absorption coefficient of the material of the photoelectric conversion layer increases as it deviates from the band end in the shorter wavelength side. In Example 1 as well, the photoelectric conversion layer 1003 has this characteristic. In other words, the photoelectric conversion layer 1003 has a characteristic to absorb a shorter wavelength of light more than a longer wavelength of light. The second reflection mirror 1002 of the PD 101 and the second reflection mirror 1002 of the PD 102 have an identical configuration, and are DBRs constituted of TiO$_2$ 2051 and SiO$_2$ 2052, which are alternately stacked.

An electrode 2061 to extract electric signals is formed in the PD 101, and an electrode 2062 to extract electric signals is formed in the PD 102. On the first reflection mirror 1001, a common cathode electrode 2063 is formed for the PD 101 and the PD 102. The electrode 2061 is electrically connected to the resonator unit 1010, and the electrode 2062 is electrically connected to the resonator unit 1020. The common cathode electrode 2063 is electrically connected to the first reflection mirror 1001.

Reflectance Spectrum and Spectral Sensitivity

The reflectance spectrum of the first reflection mirror 1001 will be described in detail next. The first reflection mirror 1001 has a structure where the thickness of only one layer (InP layer 2043) is different from the standard DBR. FIG. 3A to FIG. 3D indicate the relationship between the physical thickness of the InP layer 2043 and the reflectance spectrum of the first reflection mirror 1001. The physical thickness in FIG. 3A to FIG. 3D is expressed by a difference Δd from the physical thickness 120 nm (physical thickness of InP layer 2042) when the optical thickness is a quarter of the wavelength λ=1520 [nm].

Figure 3A:
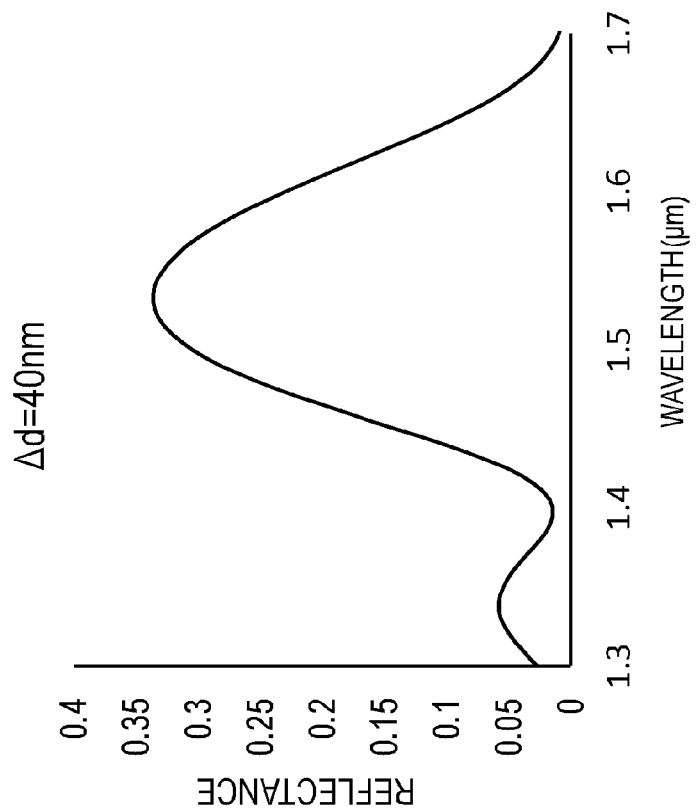
FIG. 3A to FIG. 3D are graphs for describing a reflectance spectrum according to Example 1.

FIG. 3A indicates a reflectance spectrum in the case of Δd=0, that is, in the case where the optical thickness of the InP layer 2043 is λ/4 (first reflection mirror 1001 is a standard DBR). In this case, the reflectance spectrum is the same as that of the standard DBR, and has a spectral shape of which peak is at the center wavelength.

Figure 3B:
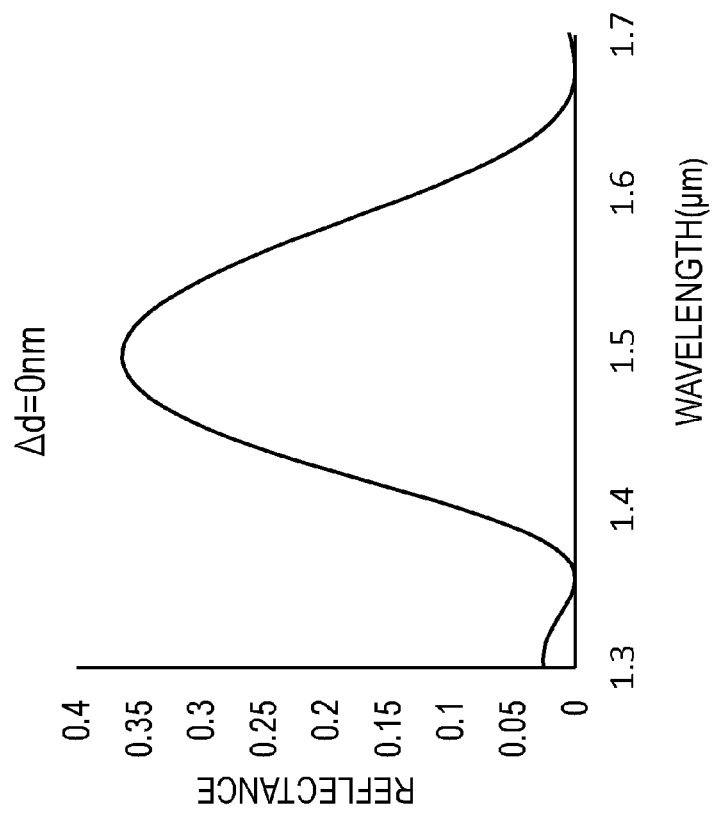

FIG. 3B indicates a reflectance spectrum in the case of Δd=40 nm. In this case, compared with the case of Δd=0 nm, the wavelength at which the reflectance is the global maximum deviates to the longer wavelength side, and the local maximum value on the shorter wavelength side increases.

Figure 3C:
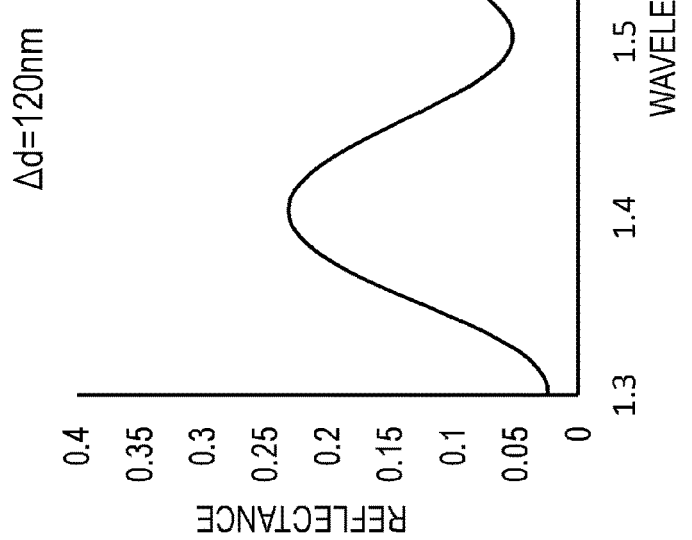

FIG. 3C indicates a reflectance spectrum in the case of Δd=80 nm. In this case, compared with the case of Δd=40 nm, the wavelength at which the reflectance is the global maximum is further deviates to the longer wavelength side, and the local maximum value on the shorter wavelength side further increases.

Figure 3D:
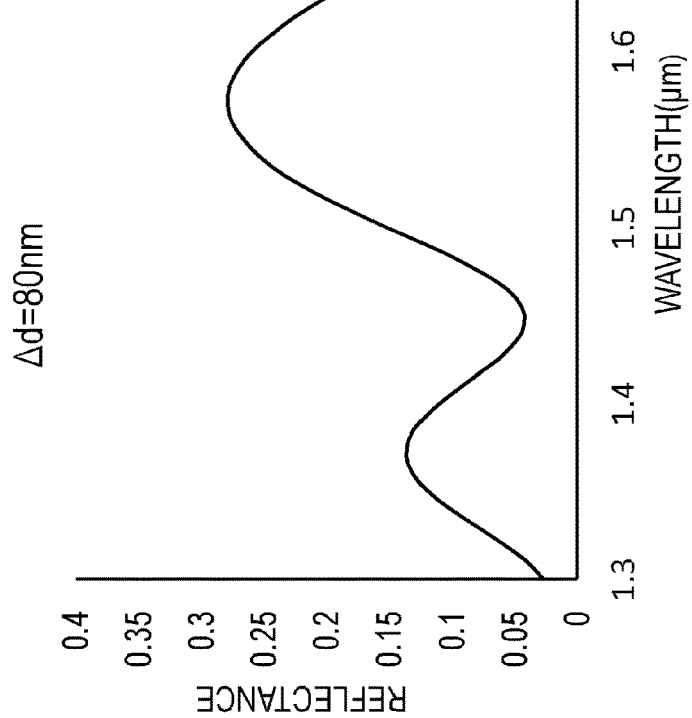

FIG. 3D indicates a reflectance spectrum in the case of Δd=120 nm, that is, the reflectance spectrum in the case where the optical thickness of Δd is λ/4. In this case, two local maximum values, which are approximately the same level, are generated side by side, and the reflectance at the center wavelength in the case of Δd=0 is the local minimum.

In Example 1, the two wavelengths at which the local maximum values are generated, as indicated in FIG. 3D, for example, are matched with the resonance wavelengths of the PD 101 and PD 102 by increasing Δd of the InP layer 2043. Thereby the reflectance values at two specific wavelengths, which are distant from each other, can be improved even by a small number of layers of the DBR, whereby the effect of the resonator can be improved.

Furthermore, the first reflection mirror 1001 is configured such that the wavelength at around the local maximum value of the reflectance spectrum matches with the resonance wavelength. In the area around the local maximum value, the inclination of the reflectance spectrum is small, hence even if the resonance wavelength of each PD deviates from the wavelength at the local maximum value of the reflectance, the influence on the reflectance is small. In the case of a standard DBR, as indicated in FIG. 3A, the reflectances at 1.4 μm and 1.6 μm wavelengths of the received light in Example 1 are at sections where the inclination is large in the reflectance spectrum. Therefore if the resonance wavelengths of PD near the wavelength=1.4 μm and the wavelength=1.6 μm deviate, the reflectance of the lower reflection mirror, constituting the resonator, deviates considerably, and as a result the device characteristic of PD and the peak value of a specific spectral sensitivity also fluctuate considerably. Therefore as indicated in FIG. 3D, it is preferable that the wavelength at an area near the local maximum value of the reflectance spectrum matches with the resonance wavelength.

Figure 4A:
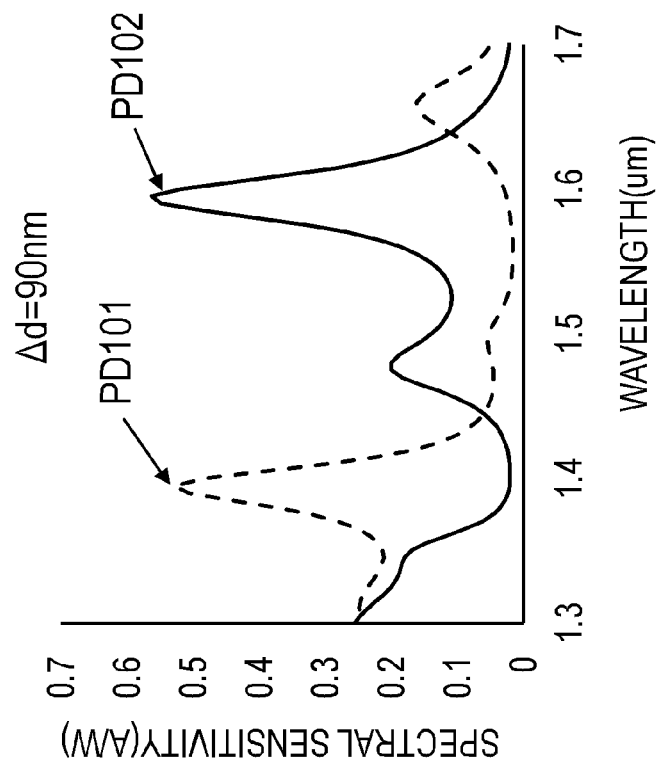
FIG. 4A to FIG. 4C are graphs for describing a spectral sensitivity according to Example 1.
Figure 4B:
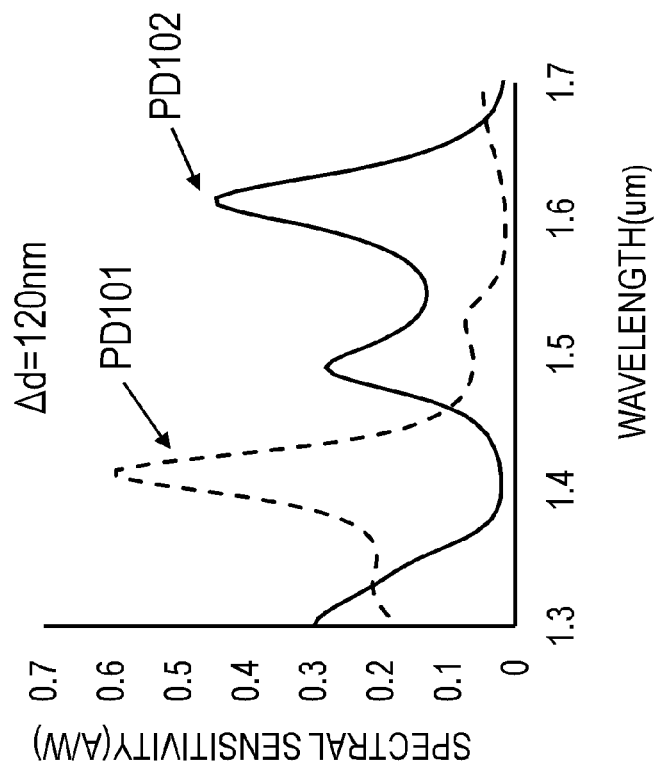
Figure 4C:
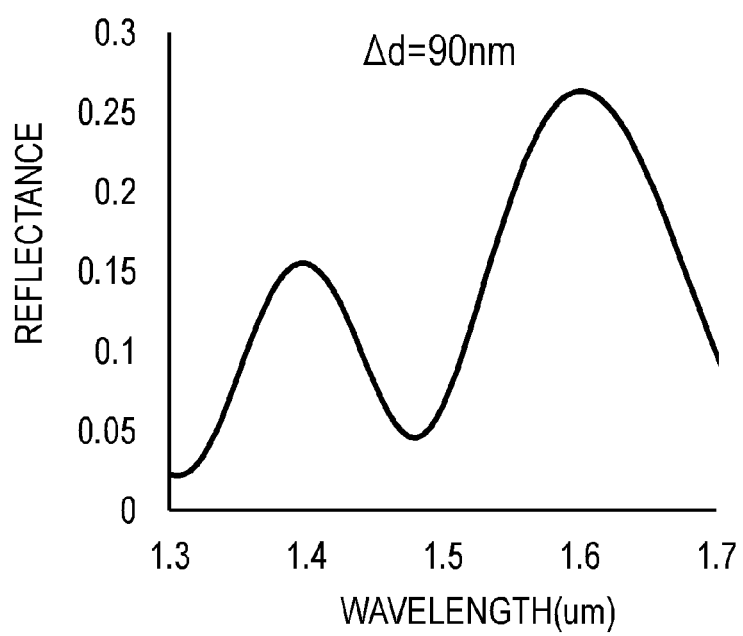

In Example 1, Δd is not 120 nm where two local maximum values of the reflectance are similar, as indicated in FIG. 3D, but is 90 nm where the two local maximum values of the reflectance are different. Δd=90 nm is used because the peak values of the spectral sensitivity of the PD 101 and the PD 102 can be close to each other, considering the characteristic of the photoelectric conversion layer 1003 that absorbs the short wavelength of light more than the long wavelength of light. FIG. 4A indicates the spectral sensitivity of each PD (PD 101 and PD 102) in the case of Δd=120 nm, and FIG. 4B indicates the spectral sensitivity of each PD in the case of Δd=90 nm. FIG. 4C is the reflectance spectrum of the first reflection mirror 1001 in the case of Δd=90 nm.

In the case of Δd=120 nm, the spectral sensitivity values of the two PDs have a 1.3 times difference, as indicated in FIG. 4A. In the case of Δd=90 nm, the two local maximum values of the reflectance are about 0.15 and 0.25, that is, the two values have about a 1.7 times difference, as indicated in FIG. 4C. In other words, the local maximum value of the reflectance on the longer wavelength side (peak reflectance on the longer wavelength side) is larger than the local maximum value of the reflectance on the shorter wavelength side (peak reflectance on the shorter wavelength side). However, in the case of Δd=90 nm, the peak values of the spectral sensitivity of the two PDs have about a 10% difference, as indicated in FIG. 4B. In this way, in Example 1, it is designed such that the peak values of the spectral sensitivity of the two PDs become close to each other by creating a difference between the local maximum values of the reflectance at two wavelengths. In concrete terms, by increasing the reflectance at the resonance wavelength of the PD on the side to increase the spectral sensitivity, the spectral sensitivity at this resonance wavelength is increased.

The absorption coefficient of the material of the photo-electric conversion layer 1003 increases as it deviates from the band end on the shorter wavelength side. According to this characteristic, compared with the case where the reflectance at the resonance wavelength is the same between each PD, the peak values of the spectral sensitivity of the two PDs are corrected to become closer to each other by setting the local maximum value on the longer wavelength side, out of the two local maximum values of the reflectance spectrum, to be larger than the other. In the case of performing correction like this, Δd is more than 0 and not more than 120 nm, in other words, Δd is more than 0 and not more than $\lambda/4$ of the optical thickness. As mentioned above, Δd is defined as the physical thickness corresponding to a value determined by subtracting the optical thickness $\lambda/4$ from the optical thickness of a specific layer of which the optical thickness is different from $\lambda/4$. Hence a preferable range of the optical film thickness of the specific layer, of which optical thickness is different from $\lambda/4$, is more than $\lambda/4$ and not more than $\lambda/2$ (more than a quarter of $\lambda$ and not more than a half of $\lambda$).

As mentioned above, it is preferable that the resonance wavelength of each PD matches with the wavelength at the local maximum value of the reflectance of the first reflection mirror 1001. However, in actual fabrication, a slight error is generated. Therefore it is acceptable if each resonance wavelength of the two PDs correspond to each of the different peaks of the reflectance spectrum of the first reflection mirror 1001 respectively. According to the variation amount of the reflectance and the spectrum sensitivity in FIG. 4A and FIG. 4B, the permissible range of the reflectance (permissible rate of variation from the peak value) is 15% if the variation of the spectral sensitivity is kept to within 10%. In other words, if the two resonance wavelengths are $\lambda 1$ and $\lambda 2$, it is preferable that the reflectance of the first reflection mirror 1001 (reflectance) has a first peak corresponding to the resonance wavelength $\lambda 1$ and a second peak corresponding to the resonance wavelength $\lambda 2$. Further, it is preferable that the reflectance of the first reflection mirror 1001 at the resonance wavelength $\lambda 1$ is at least 85% of the local maximum value at a wavelength closest to $\lambda 1$ (reflectance at the first peak) out of the wavelengths having the local maximum value of the reflectance. In the same manner, it is preferable that the reflectance of the first reflection mirror 1001 at the resonance wavelength $\lambda 2$ is at least 85% of the local maximum value at a wavelength closest to $\lambda 2$ (reflectance at the second peak) out of the wavelengths having the local maximum value of the reflectance.

In the design of Example 1, the layer thickness of only one specific layer of a standard DBR is changed so that the reflectance of the first reflection mirror 1001 is at least a predetermined reflectance value (at least a predetermined value) at two specific wavelengths. An advantage of this design is that the first reflection mirror 1001 can be easily manufactured, since the film thickness of the DBR can be easily adjusted in actual manufacturing. In concrete terms, a manufacturing method of depositing the film of the standard DBR, detecting the center wavelength of the DBR by the reflectance spectral measurement, feeding back the result to tune the film deposition conditions, and adjusting the thickness of the specific one layer, can be used. This is because in the first reflection mirror 1001, the layers are the same as the standard DBR except for the specific one layer, and even this one layer is formed of the same material as a layer having the characteristic of the DBR, therefore the thickness can be easily adjusted by controlling the film deposition time.

In Example 1, the optical thickness of a layer that is alternately stacked in the DBR (layer corresponding to the layer of the standard DBR) is assumed to be 1520 nm. If this optical thickness is 1500 nm (center value between 1.4 μm and 1.6 μm) instead, the reflectance spectrum deviates to the shorter wavelength side by 20 nm, compared with the case where this optical thickness is 1520 nm, which has the local maximum values of the reflectance at 1.4 μm and 1.6 μm. However, in the case where "the variation rate of the reflectance is within 15%", as mentioned above, it is permissible if the optical thickness of each layer which is alternately stacked in the DBR is within a 2.0% error from 1520 nm according to FIG. 4C. Therefore this optical thickness of 1500 nm is permissible.

However, if the film thickness of each layer that is alternately stacked in the DBR deviates by 1%, the center wavelength of the DBR deviates by about 15 nm in the 1.5 μm wavelength band. This 15 nm deviation may influence the reflectance of the DBR or the PD spectral sensitivity characteristic. Therefore ideally the configuration of Example 1, which can directly and accurately adjust the center wavelength, is preferred.

On the other hand, in the DBR, 1% deviation of film thickness is permissible for the film thickness of the specific one layer of which optical thickness is different from the other layers. For example, in a comparison between FIG. 3C and FIG. 3D, the film thickness deviates by 40 nm (about an 18% deviation), but the difference of spectral sensitivity is 0.1 A/W (about 20%). Therefore the film thickness of the specific one layer can be implemented by, for example, a method of estimating the film deposition conditions of the specific one layer by multiplying the film deposition condition acquired by the standard DBR by a coefficient in accordance with the film thickness ratio and depositing the film.

As described above, according to Example 1, the layer having a different optical thickness from the standard DBR is formed, and the reflectance is adjusted, whereby the first reflection mirror 1001 having the two local maximum values of the reflectance can be accurately implemented.

A practical range of one band of the reflectance spectrum of the DBR is about 100 to 150 nm, hence conventionally it has been difficult to sufficiently reflect the two wavelengths of light of which wavelength difference is more than 150 nm. In the case of the first reflection mirror of Example 1, on the other hand, the two wavelengths of light (1.4 μm and 1.6 μm) of which wavelength difference is more than 150 nm can be sufficiently reflected. Therefore a light-receiving element which includes a plurality of photodiodes formed on a same substrate and has sensitivity peaks for two wavelengths of light of which wavelengths are completely different, can be implemented.

EXAMPLE 2

A light-receiving element 6 according to Example 2, which implements the lower reflection mirror by stacking two reflection mirrors, will be described. FIG. 5 is a cross-sectional view of the light-receiving element 6 according to Example 2. In Example 2, two DBRs of which center wavelengths are different from each other, are stacked in the light-receiving element 6 in order to widen the band of the reflectance spectrum of the lower reflection mirror. A composing element the same as the light-receiving element 1 according to Example 1 is denoted with the same reference sign, and detailed description thereof is omitted. In some cases, however, the composition of the material, film thickness and the like may be different, even if the reference signs are the same.

Configuration of Semiconductor Element

A semiconductor element 6 includes two PDs, PD 601 and PD 602. The PD 601 and the PD 602 share a common (same) semiconductor substrate 1000, first reflection mirror 6001 and third reflection mirror 6101. In Example 2, the lower reflection mirror is formed by two reflection mirrors which are stacked, and one is the first reflection mirror 6001 and the other is the third reflection mirror 6101. The PD 601 includes the resonator unit 1010 and the PD 602 includes the resonator unit 1020. On top of the resonator unit 1010 and the resonator unit 1020, the second reflection mirror 1002, which is the upper reflection mirror, is formed respectively. The second reflection mirror 1002 of the PD 601 and that of the PD 602 are formed of a same material. The resonance wavelength of the PD 601 is 1.39 μm, and the resonance wavelength of the PD 602 is 1.77 μm.

The first reflection mirror 6001 is a DBR constituted of an InGaAsP layer 6041 of which physical thickness is about 131 nm and an InP layer 6042 of which physical thickness is about 144 nm, which are alternately stacked as eight pairs, and the optical thickness of one layer of the InGaAsP layer 6041 and that of the InP layer 6042 are a quarter of the wavelength λ=1800 nm (wavelength: λ3) respectively. This optical thickness of the layer may be the same value (or approximately the same value) as the resonance wavelength of the PD 602.

The third reflection mirror 6101 is a DBR that is stacked on top of the first reflection mirror 6001, and is formed under the resonator unit 1010 and the resonator unit 1020. The third reflection mirror 6101 is constituted of an InGaAsP layer 6141 of which physical thickness is about 97 nm and an InP layer 6142 of which physical thickness is about 111 nm, which are alternately stacked as four pairs, and the optical thickness of one layer of the InGaAsP layer 6141 and that of the InP layer 6142 are a quarter of the wavelength λ'=1400 nm (wavelength: λ4) respectively. This optical thickness of the layer may be the same value (or approximately the same value) as the resonance wavelength of the PD 601. In the first reflection mirror 6001 and the third reflection mirror 6101, a number of pairs of the InP layer and the InGaAsP layer that are stacked is not limited to the above mentioned value, but may be an arbitrary number.

By differentiating the optical thickness of the layer between the first reflection mirror 6001 and the third reflection mirror 6101 like this, the center wavelength of the reflectance spectrum is differentiated between the first reflection mirror 6001 and the third reflection mirror 6101. More specifically, the center wavelength of the first reflection mirror 6001 is set to a value similar to the resonance wavelength of the PD 602, and the center wavelength of the third reflection mirror 6101 is set to a value similar to the resonance wavelength of the PD 601. Thereby in the configuration of stacking the two reflection mirrors, the local maximum values of the reflectance can be positioned at wavelengths around 1800 nm and 1400 nm. FIG. 5 does not illustrate all the layers corresponding to the number of layers stacked in each reflection mirror, but represents only a part of the layers.

The resonator unit 1020 is basically constituted of the InP layer and the InGaAsSb photoelectric conversion layer 1003. The physical thickness of the InP layer under the photoelectric conversion layer 1003 is 140 nm, and the physical thickness of the InP layer on top of the photoelectric conversion layer 1003 is 270 nm. The physical thickness of the photoelectric conversion layer 1003 is 100 nm.

The resonator unit 1010 is basically constituted of the InP layer and the InGaAs photoelectric conversion layer 1003, and the configuration from the interface between the first reflection mirror 6001 and the resonator unit of the PD 601 to the photoelectric conversion layer 1003 is the same as the configuration of the PD 602. The physical thickness of the InP layer above the photoelectric conversion layer of the PD 601 is 100 nm. The center wavelength of the second reflection mirror 1002 of the PD 601 and that of the PD 602 are 1600 nm.

Reflectance Spectrum and Spectral Sensitivity

Figure 6A:
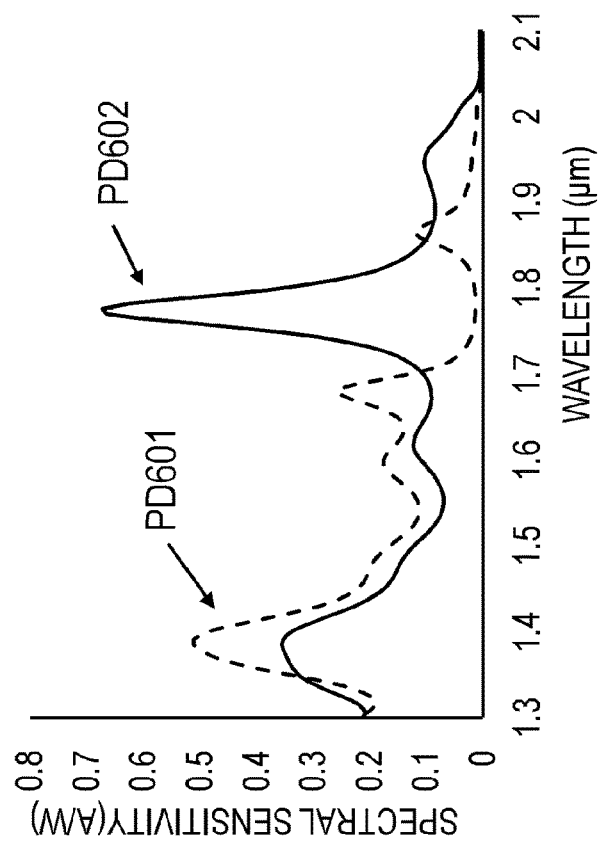
FIG. 6A is a graph for describing a reflectance spectrum according to Example 2.
Figure 6B:
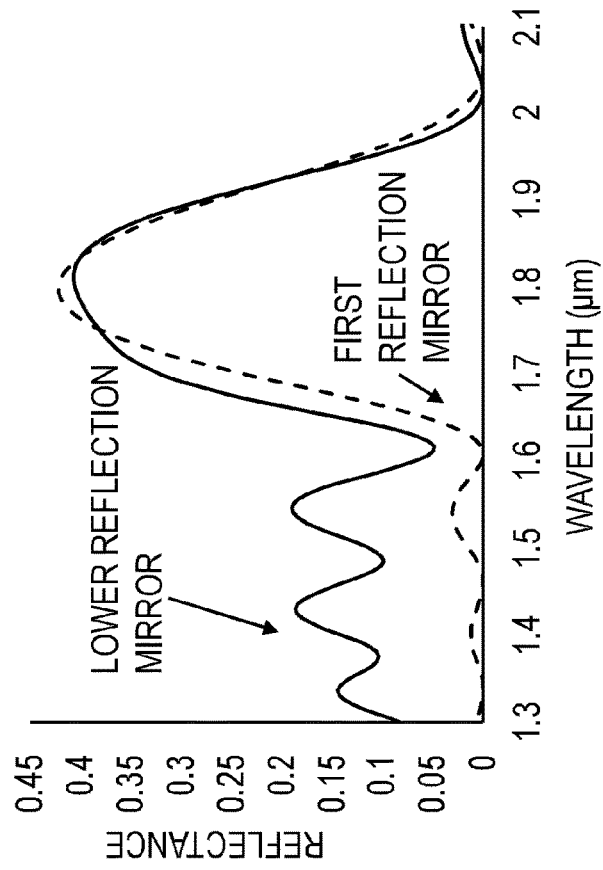
FIG. 6B is a graph for describing a spectral sensitivity according to Example 2.

FIG. 6A indicates a reflectance spectrum in the configuration according to Example 2, where the first reflection mirror 6001 and the third reflection mirror 6101 are stacked (superimposed). FIG. 6B indicates the spectral sensitivity of the PD 601 and that of PD 602 according to Example 2.

In FIG. 6A, the solid line indicates the reflectance spectrum (reflectance spectrum of the lower reflection mirror according to Example 2) in the configuration, where the first reflection mirror 6001 and the third reflection mirror 6101 are stacked. On the other hand, the broken line indicates the reflectance spectrum in the case where only the first reflection mirror 6001 exists as a comparative example. As indicated in FIG. 6A, because of the presence of the third reflection mirror 6101, the reflectance increase at around wavelength=1.3 μm to 1.6 μm with wavelength=1.4 μm as the center, compared with the case of not including the third reflection mirror 6101. In Example 2, the reflectance that is necessary for the resonator PD at around wavelength=1.4 μm and wavelength=1.8 μm can be acquired by stacking two DBRs having different center wavelengths like this.

FIG. 6B indicates the spectral sensitivity of the PD 601 and the PD 602 according to Example 2. The PD 601 has a peak of the spectral sensitivity at wavelength=1.39 μm, and the PD 602 has a peak of the spectral sensitivity at wavelength=1.77 μm. The PD 602 also has a peak of the spectral sensitivity at around wavelength=1.39 μm, but this is not the sensitivity required for the PD 602, hence information based on the light intensity at each wavelength is acquired by computing a difference of the signals from the two PDs, for example.

In Example 2, the configuration of stacking the two DBRs is used as one reflection mirror of the light-receiving element, unlike Example 1. The advantage of Example 2 over Example 1 is that the required reflectance can also be acquired at two wavelengths of which resonance wavelengths are further apart. For example, in Example 2, the required reflectance can be acquired at wavelength=1.4 μm and the wavelength=1.8 μm that are at positions 400 nm apart from each other. In the case of the configuration of Example 1, on the other hand, the wavelength difference between the two pieces of received light is 200 nm.

In terms of film thickness adjustment during film deposition by crystal growth in the lower reflection mirror, only one DBR of the first reflection mirror 1001 is fabricated and adjusted for the lower reflection mirror in the case of Example 1. In the case of the configuration of Example 2, however, it is preferable that the two DBRs of the first reflection mirror 6001 and the third reflection mirror 6101 are fabricated, and the film thicknesses thereof are adjusted respectively. Therefore Example 1 has an advantage over Example 2, since a number of times of fabrication of the DBR is less.

Concerning the shape of the reflectance spectrum, the interference of light is generated between two DBRs in Example 2, but there is no such influence of an interference in Example 1. For example, as indicated in FIG. 6A, fringes are generated on the shorter wavelength side of the wavelength=1.6 μm. These fringes are generated by the interference between the two DBRs.

In Example 2 as well, a light-receiving element (resonator type PD) that can reflect two resonance wavelengths, which are distant from each other, is implemented by locally increasing the reflectance for the two wavelengths which are so distant from each other that the standard DBR cannot reflect sufficiently. Both Examples 1 and 2 implement a monolithic light-receiving element that has two resonance wavelengths which are distant from each other, by locally increasing the reflectance near the resonance wavelengths.

The configuration of the reflection mirror disposed between the semiconductor substrate and the photoelectric conversion layer is not limited to the configurations of Examples 1 and 2, but may be a different configuration where the reflectance is locally increased near the two resonance wavelengths. For example, in the first reflection mirror 6001 of Example 2, eight pairs of two different layers are repeatedly stacked, and in the third reflection mirror 6101, four pairs of two different layers are repeatedly stacked. But the configuration of this present invention is not limited to this, and in each of the first reflection mirror 6001 and the third reflection mirror 6101, the light-receiving element may have a configuration where six pairs of two different layers are repeatedly stacked (configuration in which repeat cycles of the two DBRs are averaged) between the semiconductor substrate and the photoelectric conversion layer.

In both Examples 1 and 2, the lower reflection mirror is formed using a semiconductor material which can be crystal-grown on the InP substrate, but the lower reflection mirror may be formed using other semiconductor material systems, such as a material system that can be crystal-grown on a GaAs substrate, and a material system that can be crystal-grown on a GaSb substrate. The material can be selected in accordance with the wavelength band of the light to be received, for example. In Examples 1 and 2, two types of wavelengths of light are received by the light-receiving element, but three or more types of wavelengths may be received based on the same concept.

In the resonator units of Examples 1 and 2, each one of the upper and lower layers of the photoelectric conversion layer is an InP single film, but may be constituted of a plurality of layers. For example, when a part of the layer is removed to adjust the resonance wavelength of the PD 101 in Example 1, an etching stop layer may be disposed to improve controllability. For the reflection mirror as well, a single film having a high refractive index layer and a single film having a low refractive index layer are used in each DBR of Examples 1 and 2, but the reflection mirror in each DBR may be formed of a plurality of layers respectively.

According to Examples 1 and 2, the reflectance values at the wavelengths to implement resonance (resonance wavelength) are set to 0.155 and 0.261 in Example 1, and are set to 0.178 and 0.405 in Example 2. Hence a guideline for reflectance that is required to generate the resonance effect is at least 0.155. In other words, in order to implement the resonance effect, it is preferable that each reflectance of at the two resonance wavelengths is at least 0.155 respectively.

EXAMPLE 3

A detection system 810, to detect water and ice using the light-receiving element 1 according to Example 1, will be described in Example 3. FIG. 7A and FIG. 7B indicate a light-receiving unit 801 where the light-receiving elements 1 (PD arrays) according to Example 1 are two-dimensionally disposed on a same substrate, and a detection system 810 using the light-receiving unit 801.

As illustrated in FIG. 7A, the detection system 810 is constituted of: a light-receiving unit 801 where the light-receiving elements 1 (PD arrays) are two-dimensionally disposed on the same substrate; a read circuit 802 that reads electric signals from each PD; and metal bumps 803. The metal bump 803 electrically and mechanically connects the light-receiving unit 801 and the read circuit 802. The metal bump 803 is connected to electrodes (not illustrated) formed on the surface of the light-receiving unit 801 and the read circuit 802.

FIG. 7B is a schematic diagram depicting the flow of signal processing in the detection system 810. In the detection system 810, light from an observation target enters the light-receiving unit 801 via a lens system 850. A PD 101 and a PD 102 (not illustrated) in the light-receiving unit 801 convert the entered light into electric signals. The read circuit 802 reads the converted electric signals, and sends the electric signals to a signal processing unit 820. The signal processing unit 820 processes the electric signals in accordance with the intended use. In Example 3, the signal processing unit 820 generates a two-dimensional image by determining the ratio of the light intensity values detected by the adjacent PD 101 and the PD 102 respectively. Then the signal processing unit 820 classifies each pixel number value of the two-dimensional image according to three conditions which are based on predetermined thresholds, and generates and outputs three types of image information classified into a region indicating ice, a region indicating water and a region indicating neither. The information output by the detection system 810 can be displayed as an image, for example. Further, such information as the detected ratio of ice and water can be sent to another system.

In Example 3, the detection system to detect water and ice was described, but the present invention can also be applied to a system to detect and visualize various substances, a two-color thermometer and the like by changing the resonance wavelength of PD and the signal processing method.

In Example 3, the detection system includes the light-receiving unit where the light-receiving elements are two-dimensionally arrayed, but may include a light-receiving unit where the light-receiving elements are one-dimensionally disposed or only one set of PDs (e.g. one PD 101 and one PD 102) is disposed. The light-receiving unit may electrically connect to the read circuit by a method other than by the metal bumps.

According to the present technique described above, a light-receiving element, which includes a plurality of photodiodes formed on a same substrate and has sensitivity peaks at two completely different wavelengths of light, can be provided.

<Other Embodiments>

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-181577, filed on Oct. 1, 2019, which is hereby incorporated by reference herein in its entirety.

What is claimed is:

1. A light-receiving element, comprising a plurality of photodiodes formed by stacking in this sequence, a lower reflection mirror, a resonator including a photoelectric conversion layer, and an upper reflection mirror on a semiconductor substrate, wherein the plurality of photodiodes share the semiconductor substrate and the lower reflection mirror, the plurality of photodiodes includes a first photodiode having a resonance wavelength $\lambda 1$ and a second photodiode having a resonance wavelength $\lambda 2$ that is larger than the resonance wavelength $\lambda 1$, and a reflectance of the lower reflection mirror has a first peak corresponding to the resonance wavelength $\lambda 1$ and a second peak corresponding to the resonance wavelength $\lambda 2$.

2. The light-receiving element according to claim 1, wherein a reflectance of the lower reflection mirror at the resonance wavelength $\lambda 1$ and a reflectance of the lower reflection mirror at the resonance wavelength $\lambda 2$ are at least 0.155.

3. The light-receiving element according to claim 1, wherein a reflectance of the lower reflection mirror at the resonance wavelength $\lambda 1$ is at least 85% of a reflectance at the first peak, and a reflectance of the lower reflection mirror at the resonance wavelength $\lambda 2$ is at least 85% of a reflectance at the second peak.

4. The light-receiving element according to claim 3, wherein the reflectance at the second peak is larger than the reflectance at the first peak.

5. The light-receiving element according to claim 1, wherein a total optical thickness of layers existing between the lower reflection mirror and the upper reflection mirror is different between the first photodiode and the second photodiode.

6. The light-receiving element according to claim 1, wherein in the lower reflection mirror, a first layer formed of a first material and a second layer formed of a second material having a refractive index of being lower than that of the first material, are alternately stacked, in at least a part of the lower reflection mirror, the first layer and the second layer each having a respective optical thickness of a quarter of a specific wavelength $\lambda 3$, are alternately stacked, and the lower reflection mirror includes the second layer having an optical thickness of not a quarter of the specific wavelength $\lambda 3$.

7. The light-receiving element according to claim 6, wherein the specific wavelength $\lambda 3$ is a value between the resonance wavelength $\lambda 1$ and the resonance wavelength $\lambda 2$.

8. The light-receiving element according to claim 6, wherein an optical thickness of the second layer having an optical thickness of not a quarter of the specific wavelength $\lambda 3$ is more than a quarter of the specific wavelength $\lambda 3$, and is not more than a half of the specific wavelength $\lambda 3$.

9. The light-receiving element according to claim 1, wherein the lower reflection mirror is formed of two reflection mirrors which are stacked, in each of the two reflection mirrors, a first layer formed of a first material and a second layer formed of a second material having a refractive index of being lower than that of the first material, are alternately stacked, in one of the two reflection mirrors, the first layer and the second layer each having a respective optical thickness of a quarter of a specific wavelength $\lambda 3$, are alternately stacked, and in the other of the two reflection mirrors, the first layer and the second layer each having a respective optical thickness of a quarter of a specific wavelength $\lambda 4$ that is different from the specific wavelength $\lambda 3$, are alternately stacked.

10. The light-receiving element according to claim 9, wherein the specific wavelength $\lambda 3$ has approximately same value as the resonance wavelength $\lambda 1$, and the specific wavelength λ4 has approximately same value as the resonance wavelength λ2.

11. The light-receiving element according to claim 1, wherein the semiconductor substrate is an InP substrate, and a difference between the resonance wavelength λ1 and the resonance wavelength λ2 is more than 150 nm.

12. A detection system, comprising:

a light-receiving unit configured to include the light-receiving element according to claim 1 and to convert entered light into signals;

a read unit configured to read signals from the light-receiving unit; and a signal processing unit configured to output information based on the signals.

\* \* \* \* \*